United States Patent
Yu et al.

(10) Patent No.: US 11,631,966 B2
(45) Date of Patent: Apr. 18, 2023

(54) BEAM COMBINING DEVICE AND BEAM COMBINING METHOD FOR BRAGG GRATING EXTERNAL-CAVITY LASER MODULE

(71) Applicants: Suzhou Everbright Photonics Co., Ltd., Jiangsu (CN); Everbright Institute of Semiconductor Photonics Co., Ltd., Jiangsu (CN)

(72) Inventors: Hao Yu, Suzhou (CN); Shujuan Sun, Suzhou (CN); Jun Wang, Suzhou (CN); Huadong Pan, Suzhou (CN); Dayong Min, Suzhou (CN)

(73) Assignees: Suzhou Everbright Photonics Co., Ltd., Jiangsu (CN); Everbright Institute of Semiconductor Photonics Co., Ltd., Jiangsu (CN)

( * ) Notice: Subject to any disclaimer, the term of this patent is extended or adjusted under 35 U.S.C. 154(b) by 0 days.

(21) Appl. No.: 17/622,964

(22) PCT Filed: May 29, 2020

(86) PCT No.: PCT/CN2020/093137
§ 371 (c)(1),
(2) Date: Dec. 27, 2021

(87) PCT Pub. No.: WO2020/259198
PCT Pub. Date: Dec. 30, 2020

(65) Prior Publication Data
US 2022/0271501 A1 Aug. 25, 2022

(30) Foreign Application Priority Data
Jun. 27, 2019 (CN) .......................... 201910569713.2

(51) Int. Cl.
*H01S 5/14* (2006.01)
*H01S 5/065* (2006.01)
(Continued)

(52) U.S. Cl.
CPC ........ *H01S 5/0657* (2013.01); *H01S 5/02251* (2021.01); *H01S 5/02415* (2013.01);
(Continued)

(58) Field of Classification Search
CPC ............... H01S 5/0657; H01S 5/02251; H01S 5/02415; H01S 5/141; H01S 5/4012; H01S 5/4025; H01S 5/4006; H01S 5/4087
See application file for complete search history.

(56) References Cited

U.S. PATENT DOCUMENTS 8,526,110 B1 * 9/2013 Honea ................... H01S 3/2391
359/556
2003/0206336 A1 11/2003 Onaka et al.
(Continued)

FOREIGN PATENT DOCUMENTS

CN 1658453 A 8/2005
CN 103078253 A 5/2013
(Continued)

OTHER PUBLICATIONS

Search Report and Written Opinion pertaining to Application No. PCT/CN2020/093137 dated Aug. 26, 2020.
(Continued)

*Primary Examiner* — Yuanda Zhang
(74) *Attorney, Agent, or Firm* — Dinsmore & Shohl LLP

(57) ABSTRACT

A beam combining device and method for a Bragg grating external-cavity laser module has a plurality of side by side light-emitting modules that use a Bragg grating to perform wavelength locking. Output light of the modules is incident
(Continued)

US 11,631,966 B2

Page 2 to a beam combining element after passing through a focusing optical element for beam combining, and light subjected to beam combining is reflected partially and transmitted partially under the effect of a light splitting element. A part is incident into a dispersion element at a diffraction angle of the element. Parallel light is formed under the effect of a conversion optical element. Spots of the light beams of corresponding wavelengths of the light-emitting modules are formed on an image acquisition mechanism. Whether the wavelengths of the corresponding light-emitting modules are locked is determined by whether there is a deviation between preset spots and spots formed by the module on the acquisition mechanism.

9 Claims, 6 Drawing Sheets

(51) Int. Cl.
*H01S 5/02251* (2021.01)
*H01S 5/024* (2006.01)
*H01S 5/40* (2006.01)

(52) U.S. Cl.
CPC ............ *H01S 5/141* (2013.01); *H01S 5/4012* (2013.01); *H01S 5/4025* (2013.01); *H01S 5/4006* (2013.01); *H01S 5/4087* (2013.01)

(56) References Cited

U.S. PATENT DOCUMENTS

2011/0249692 A1* 10/2011 Honea .................. G02B 6/32
372/29.011
2019/0273365 A1* 9/2019 Zediker .............. H01S 5/02251

FOREIGN PATENT DOCUMENTS

| CN | 103441419 A | 12/2013 |
| CN | 103904557 A | 7/2014 |
| CN | 104901149 A | 9/2015 |
| CN | 105140769 A | 12/2015 |
| CN | 108254930 A | 7/2018 |

OTHER PUBLICATIONS

Office Action pertaining to Application No. CN201910569713.2 dated Jun. 11, 2020.
Chinese Office Action in corresponding Chinese Application No. 201910569713.2 dated Jun. 11, 2020.

* cited by examiner

BEAM COMBINING DEVICE AND BEAM COMBINING METHOD FOR BRAGG GRATING EXTERNAL-CAVITY LASER MODULE

CROSS-REFERENCE TO RELATED APPLICATIONS

This application is the U.S. National Stage of PCT/CN2020/093137 filed May 29, 2020, which claims priority to Chinese Patent Application No. 201910569713.2 filed Jun. 27, 2019, the content of both of which are incorporated herein by reference in their entirety.

TECHNICAL FIELD

The present application relates to the technical field of lasers, in particular to a beam combining device and a beam combining method for a Bragg grating external-cavity laser module.

BACKGROUND ART

High-power laser chips are often used as pump sources for solid-state lasers (e.g., sheets, fibers and slab lasers), therefore, their efficiency, and spatial and spectral characteristics of laser emission determine the performance of solid-state lasers. High-power laser chips are also used directly in such industrial fields as material processing (e.g., surface treatment, welding, additive manufacturing, cutting), and show potential to replace solid-state and fiber lasers. The increase in output power and brightness is a main driving force for expanding the application range of direct high-power laser chips. High-power and high-brightness laser output is usually obtained through the beam combining technology.

The laser beam combining technology is one of the effective methods to obtain high-brightness and high-power semiconductor laser output. As to spectral beam combining, the wavelengths of different laser chips are locked at a certain wavelength through the feedback of an external cavity, and a dispersion element is used to combine beams of different wavelengths into one beam, however, the external-cavity spectral beam combining will lead to deterioration of beam quality due to the problem of crosstalk. In addition, multiple laser chips are in the same external cavity, the directivity consistency of each laser chip needs to be strictly controlled to ensure that all the laser chips can start oscillation, otherwise, partial locking of some laser chips will also result in a decrease in beam quality and efficiency.

In recent years, a Bragg grating (VBG grating) feedback method has been used to achieve wavelength locking of high-power laser chips and narrowing of spectral line width, to enhance the adaptability to the environment and expand its application range.

In the prior art, the beam combining device for a VBG grating external-cavity laser module includes a number of light-emitting modules arranged side by side at required intervals, a Fourier transform lens and a grating. Wherein each light-emitting module includes a laser unit capable of emitting laser, and a Bragg grating configured to receive different wavelengths emitted by the laser unit, the Bragg grating has a preset locked wavelength, such that different lasers emitted by each laser unit are locked on laser of a preset wavelength and are emitted; each light-emitting module locks lasers of different wavelengths to form parallel light, then the parallel light is incident to the Fourier transform lens, is focused on the grating through the Fourier transform lens, and is then diffracted by the grating to form beam combining light and is irradiated out.

However, as to the above beam combining device for a VBG grating external-cavity laser module, during actual use, due to a deviation existing between the laser wavelength actually locked by the Bragg grating of each light-emitting module and the preset locked laser wavelength, then a deviation exists between the laser wavelength contained in the beam combining light output by the transmission grating and the laser wavelength contained in the theoretical beam combining light, thereby resulting in a decrease in quality and power of the beam combining light, however, it is difficult for the beam combining device for a VBG grating external-cavity laser module in the prior art to detect or judge lasers of which wavelengths in the beam combining light are deviated from the theoretical wavelength laser.

SUMMARY OF THE INVENTION

Therefore, the technical problem to be solved in the present application is that it is difficult for the existing beam combining device for a VBG grating external-cavity laser module to detect or judge lasers of which wavelengths in the beam combining light are deviated from the theoretical wavelength laser.

An object of the present application is to provide a beam combining device for a Bragg grating external-cavity laser module, including: at least two light-emitting modules arranged side by side at intervals, wherein any one of the light-emitting modules includes a laser unit capable of emitting laser and a Bragg grating configured to receive laser emitted by the laser unit, and one light-emitting module serves as a reference light-emitting module; a focusing optical element arranged on an output optical path of all the light-emitting modules; and a beam combining element arranged on the focusing position of the output optical path of the focusing optical element; and further including:

a light splitting element, arranged on an output optical path of the beam combining element;

a dispersion element, arranged on any one of the output optical paths of the light splitting element, and configured to disperse beam combining light into dispersed light consistent with a relative positional relationship of the laser of each wavelength between the focusing optical element and the beam combining element;

a conversion optical element, arranged on an output optical path of the dispersion element, and configured to transmit the dispersed light into parallel light; and an image acquisition mechanism, arranged on an output optical path of the conversion optical element, and configured to acquire spots illuminated by the parallel light on the output optical path of the conversion optical element.

Preferably, as to the beam combining device for a Bragg grating external-cavity laser module, at least three light-emitting modules are available, and all the light-emitting modules are arranged side by side at equal intervals.

Preferably, as to the beam combining device for a Bragg grating external-cavity laser module, the beam combining element and the dispersion element are both gratings.

Preferably, as to the beam combining device for a Bragg grating external-cavity laser module, the beam combining element and the dispersion element are both transmission gratings or reflection gratings, a diffraction angle formed when the beam combining light passes through the beam combining element is a grating blaze angle of the beam combining element, and an incident angle formed when the beam combining light is incident to the dispersion element is a grating blaze angle of the dispersion element.

Preferably, as to the beam combining device for a Bragg grating external-cavity laser module, any one of the light-emitting modules further includes an optical fiber arranged on an output optical path of the Bragg grating.

Preferably, the beam combining device for a Bragg grating external-cavity laser module further includes a temperature control device, and the temperature control device includes:

a temperature adjustment element, arranged on the Bragg grating;

a temperature detection element, configured to detect temperature of the Bragg grating; and a controller, electrically connected with both the temperature adjustment element and the temperature detection element, wherein the controller controls the temperature rise or reduction of the temperature adjustment element according to detection signals of the temperature detection element.

The object of the present application is to further provide a beam combining method based on the above beam combining device for a Bragg grating external-cavity laser module, including the following steps:

acquiring an image, wherein the image includes a reference spot and a number of spots to be compared, the reference spot corresponds to a laser of the output wavelength of the reference light-emitting module, and the spots to be compared are in one-to-one correspondence with the lasers of the output wavelengths of other light-emitting modules;

acquiring a preset spot range respectively corresponding to each spot to be compared based on the reference spot;

comparing any one of the spots to be compared with corresponding preset spot range;

judging whether the spot to be compared falls within corresponding preset spot range; and adjusting a locked wavelength of the Bragg grating in the light-emitting module corresponding to the spot to be compared if the spot to be compared exceeds corresponding preset spot range, such that the spot to be compared falls within corresponding preset spot range.

Preferably, as to the beam combining method based on the beam combining device for a Bragg grating external-cavity laser module, in the step of judging whether the spot to be compared falls within corresponding preset spot range, a deviation between the spot to be compared and the corresponding preset spot is no greater than 2 pixel points, indicating that the spot to be compared falls within corresponding preset spot range.

Preferably, as to the beam combining method based on the beam combining device for a Bragg grating external-cavity laser module, in the step of adjusting a locked wavelength of the Bragg grating in the light-emitting module corresponding to the spot to be compared if the spot to be compared exceeds corresponding preset spot range, the locked wavelength of the Bragg grating is adjusted through adjusting the temperature of the Bragg grating in the light-emitting module corresponding to the spot to be compared.

Preferably, as to the beam combining method based on the beam combining device for a Bragg grating external-cavity laser module, in the step of acquiring a preset spot range respectively corresponding to each spot to be compared based on the reference spot, a spacing between the reference spot and the adjacent preset spot is equal to a spacing between any adjacent preset spots.

Technical solutions of the present application have the following advantages:

1. A beam combining device for a VBG grating external-cavity laser module provided in the present application includes a plurality of light-emitting modules arranged side by side, the light-emitting modules adopt Bragg gratings for wavelength locking; the output light passes through a focusing optical element and is then incident to a beam combining element, and is combined under the effect of the beam combining element, under the effect of a light splitting element, part of the beam combining light is reflected onto a dispersion element to be dispersed into sub-beams of different emergence angles, forms parallel light under the effect of a conversion optical element, and forms spots of the light beams of corresponding wavelengths of the light-emitting module on an image acquisition mechanism; whether the wavelengths of the corresponding light-emitting modules are locked is judged by judging whether a deviation exists between spots formed by the light-emitting modules on the image acquisition mechanism and preset spots, thereby effectively solving the problem of low beam quality of the beam combining device due to the fact that the existing light-emitting module cannot judge and detect the locked wavelengths. The beam combining device is simple in structure, quick in judgment and detection, and easy to adjust.

2. As to the beam combining device for a VBG grating external-cavity laser module provided in the present application, each light-emitting module includes a plurality of laser chips, a plurality of laser chips are arranged in steps to achieve spatial beam combining, the laser emitted by a plurality of laser chips in each module is locked at the same wavelength, no crosstalk exists, and the problem of limited beam combining unit in spatial beam combining is also solved, a plurality of lasers can be integrated in a smaller space, such that the size of the whole laser chip module is smaller; and a larger number of single-tube beams may be coupled to optical fiber, so as to have a greater output power and a high brightness of the combined output beam.

3. The beam combining device for a VBG grating external-cavity laser module provided in the present application includes a temperature control device connected with the Bragg grating, the temperature control device includes a heating element, a temperature detection element and a controller, when the spot corresponding to the light-emitting module acquired by the image acquisition mechanism is deviated, the controller controls the heating element to turn on or turn off according to the detection signals of the temperature detection element, the deviated Bragg grating of the light-emitting module is subjected to temperature adjustment through the temperature control device, such that the output light of the light-emitting module reaches a preset locked wavelength.

4. As to the beam combining method based on the beam combining device for a VBG grating external-cavity laser module provided in the present application, an image is acquired through an image acquisition device, the spot formed by the reference light-emitting module on the image acquisition mechanism is taken as a reference spot, and the other spots are taken as spots to be compared, each spot corresponds to the laser of the output wavelength of one light-emitting module; with the reference spot as a reference, the preset spot range respectively corresponding to each spot to be compared is acquired; the spot to be compared is compared with the corresponding preset spot range; whether the spot to be compared falls within corresponding preset spot range is judged; the locked wavelength of the Bragg grating in the light-emitting module corresponding to the spot to be compared is adjusted if the spot to be compared exceeds corresponding preset spot range, such that the spot to be compared falls within corresponding preset spot range. The preset spot range of the spot of the module to be compared on the image acquisition mechanism is calculated with the spot of the reference module on the image acquisition mechanism, then the spot of the module to be compared acquired by the image is compared with the preset spot range, whether a deviation exists is judged, that is, whether the spot to be compared falls within the preset spot range is judged. Using the relationship between deviation and diffraction angle formed after passing through the diffusion element and according to a grating equation, the deviation is converted into wavelength, and using the relationship between the wavelength and the temperature of Bragg grating, the deviation is converted into temperature difference, and the locked wavelength is adjusted through adjusting the temperature of the Bragg grating; the beam combining method is simple and the adjustment is quick and effective.

BRIEF DESCRIPTION OF THE DRAWINGS

To more clearly illustrate the technical solutions in specific embodiments of the present application or in the prior art, the accompanying drawings which need to be used in the description of the specific implementation or the prior art will be briefly introduced below. Obviously, the accompanying drawings in the following description are some embodiments of the present application, and other drawings may be obtained from these drawings by those skilled in the art without any creative effort.

REFERENCE NUMERALS

Figure 1:
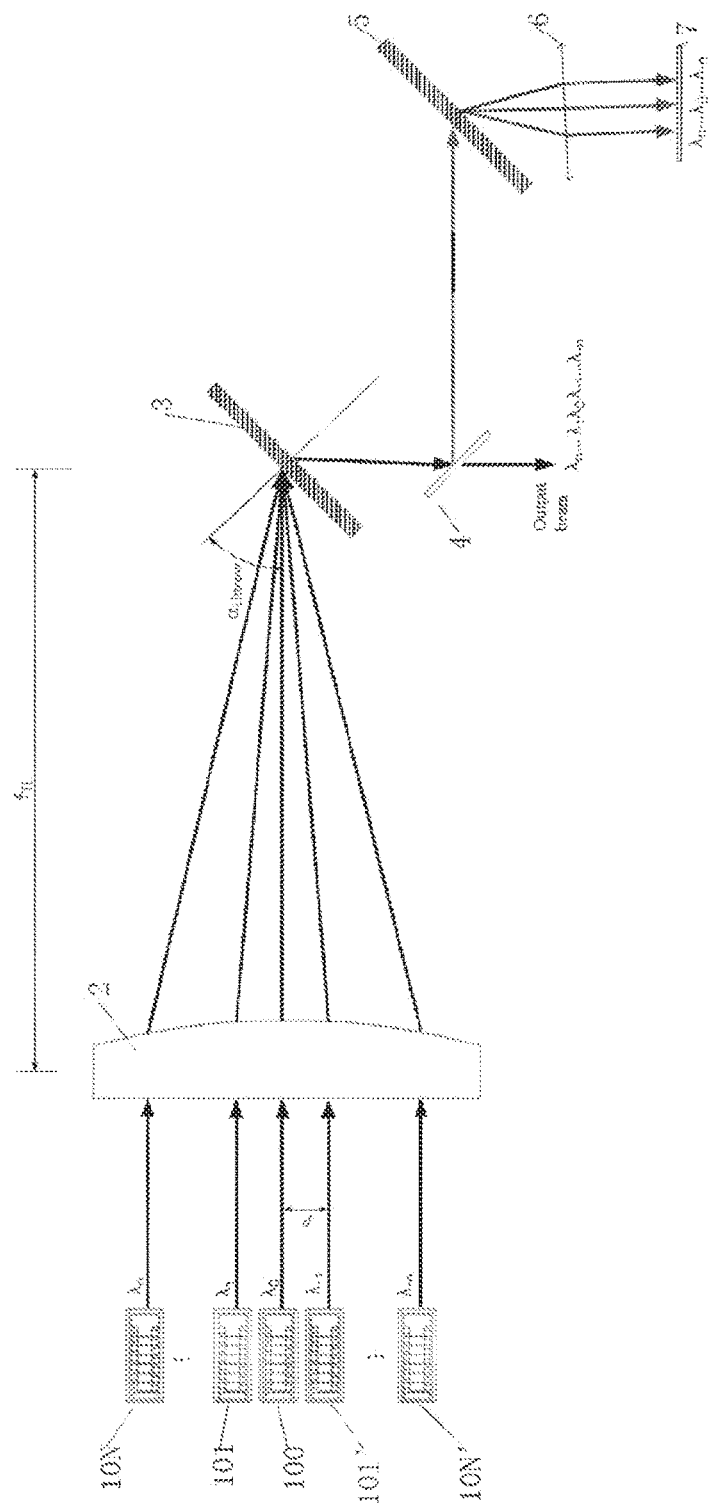
FIG. 1 is a structural diagram showing that a light-emitting module of the present application directly outputs laser and a light combining element is a transmission grating.

1—light-emitting module; 100—reference light-emitting module; 101-10N—light-emitting module; 101'-10N'—light-emitting module; 11—laser unit; 111-11$n$—laser single-tube chip; 12—fast-axis collimating lens; 121-12$n$—fast-axis collimating lens; 13—slow-axis collimating lens; 131-13$n$—slow-axis collimating lens; 14—reflector; 141-14$n$—reflector; 15—light outlet hole; 16—Bragg grating; 17—temperature control device; 18—heat-conducting glass; 19—wire;

2— focusing optical element;
   3— beam combining element;
   4— light splitting element;
   5— dispersion element;
   6— conversion optical element;
   7— image acquisition mechanism;
   8—optical fiber.

DETAILED DESCRIPTION OF THE EMBODIMENTS

The technical solutions of the present application will be clearly and completely described below in combination with the accompanying drawings, and obviously, the described embodiments are a part but not all of the embodiments of the present application. Based on the embodiments in the present application, all the other embodiments obtained by those skilled in the art without any creative effort shall all fall within the protection scope of the present application.

In the description of the present application, it should be noted that, the orientation or positional relationship indicated by such terms as "center", "up", "down", "left", "right", "vertical", "horizontal", "inner" and "outer" is the orientation or positional relationship based on the accompanying drawings. Such terms are merely for the convenience of description of the present application and simplified description, rather than indicating or implying that the device or element referred to must be located in a certain orientation or must be constructed or operated in a certain orientation, therefore, the terms cannot be understood as a limitation to the present application. In addition, the terms "first", "second" and "third" are merely for descriptive purpose, rather than indicating or implying relative importance.

In the description of the present application, it should be noted that, unless otherwise stipulated and defined definitely, such terms as "installed", "connected" and "in connection" should be understood in their broad sense, e.g., the connection can be a fixed connection, a detachable connection or an integral connection; can be mechanical connection or electrical connection; and can be direct connection or can be indirect connection through an intermediate, and can be communication inside two elements. For those skilled in the art, the specific meanings of the above terms in the present application can be understood according to specific conditions.

In addition, the technical features involved in different embodiments of the present application described below can be combined with each other as long as they do not conflict with each other.

Embodiment 1

As shown in FIG. 1 to FIG. 4, the beam combining device for a VBG grating external-cavity laser module of the present embodiment includes a plurality of light-emitting modules 1, a focusing optical element 2, a beam combining element 3, a light splitting element 4, a dispersion element 5, a conversion optical element 6, an image acquisition mechanism 7 and a temperature control device 17, wherein the plurality of light-emitting modules 1 are arranged in an array at intervals to emit lasers of different wavelengths, and the lasers are incident to a Bragg grating 16 to achieve wavelength locking, wherein the light-emitting module located in the middle (corresponding to the light-emitting module with a wavelength of $\lambda_0$ in the figure) is taken as the reference light-emitting module 100, the wavelength of the emitted laser is $\lambda_0$, other light-emitting modules 1 are symmetrically arranged on the upper and lower sides of the reference light-emitting module 100, the intervals between the light-emitting modules 1 are equal, the output light of the reference light-emitting module 100 is incident horizontally to the center of the focusing optical element 2 and is incident horizontally to the beam combining element 3; the output light of the light-emitting module 1 is output at a locked wavelength of $\lambda_n$ (=±1,±2,±3, . . . ,±N) after being locked by the Bragg grating 16; one focusing optical element 2 is arranged on the output optical path of all the light-emitting modules 1, to focus lasers of different locked wavelengths emitted by all the light-emitting modules 1; one beam combining element 3 is arranged at the focusing position of the focusing optical element 2, output light of different wavelengths emitted by different light-emitting modules 1 is combined to form beam combining light and is output at the same diffraction angle $\alpha_n$; the light splitting element 4 is arranged on the diffraction optical path of the beam combining element 3, the light splitting element 4 divides the beam combining light into reflected light and transmitted light, one part of the beam combining light passes through the light splitting element 4 for output, the other part of the beam combining light is reflected to the dispersion element 5 on the optical path of reflected light, the dispersion element 5 disperses the beam combining light into dispersed light consistent with the relative positional relationship of the laser of each wavelength between the focusing optical element 2 and the beam combining element 3, that is, the emergence angles $\beta_n$ formed when the output light of each light-emitting module 1 passes through the dispersion element 5 and the incident angles $\alpha_n$ formed when the output light is incident to the beam combining element 3 constitute a one-to-one correspondence relationship, for example, the first light-emitting module is incident to the beam combining element 3 at an incident angle of $\alpha_1$, and is emitted from the dispersion element at an emergence angle of $\beta_1$, the N-th light-emitting module is incident to the beam combining element 3 at an incident angle of $\alpha_N$, and is emitted from the dispersion element at an emergence angle of $\beta_N$, the light beam formed when the output light of each light-emitting module 1 passes through the beam combining element 3 and is subjected to the dispersion effect of the dispersion element 5 forms parallel spaced light under the conversion effect of a conversion optical element 6, and forms spots corresponding to wavelengths of output light of each light-emitting module 1 on the image acquisition mechanism 7 of the emergent surface of the conversion optical element 6. The number of the light-emitting module of the present application may be two, three, four, five, etc., and the specific number is not defined, one of the light-emitting modules is taken as a reference module, while other light-emitting modules take the reference module as a reference, and are symmetrically arranged on upper and lower sides of the reference module, or all the other light-emitting modules are arranged on the upper side of the reference module or all the other light-emitting modules are arranged on the lower side of the reference module, which are not specifically defined, as long as the output light of the reference module is just opposite to the center of the focusing optical element; to facilitate description and distinction, the light-emitting modules are respectively marked as 100, 101-10N, 101'-10N', and the central wavelength of each light-emitting module 1 after wavelength locking by the Bragg grating 16 is different; for example, the central wavelength of the output light of the reference light-emitting module 100 after wavelength locking by the Bragg grating 16 is Xo, the central wavelength of the output light of the light-emitting module 101 is $\lambda_1$, the central wavelength of the output light of the light-emitting module 101' is $\lambda_{-1}$, the central wavelength of the output light of the light-emitting module 10N is $\lambda_N$, the central wavelength of the output light of the light-emitting module 10N' is $\lambda_{-N}$, and the central wavelength of other light-emitting modules can be deduced by analogy.

The Bragg grating 16 of the present application is a vertical reflection Bragg grating, the reflectivity is in a range of 10% to 30%, the reflection bandwidth is less than 1 nm, the temperature drift coefficient is about 0.01 nm/° C., and the linear relationship between temperature and wavelength satisfies the following equation:

$$\lambda(T)=\lambda_0+0.01*(T-T_0)$$

wherein $\lambda(T)$ is the central wavelength at a temperature of T; $\lambda_0$ is the central wavelength at a temperature of $T_0$; and 0.01 is the wavelength drift coefficient with temperature, with a unit of nm/° C.;

the specific structure and working principle are not described and defined herein, and will be selected according to actual requirements.

The light splitting element 4 of the present application may be an existing non-polarized flat light splitter, or may also be of a cube shape, which is not specifically defined. The main purpose is to divide the output light emitted by the light-emitting module into two beams including reflected light and transmitted light. The specific structure and working principle are not described and defined herein, and will be selected according to actual requirements.

Figure 5:
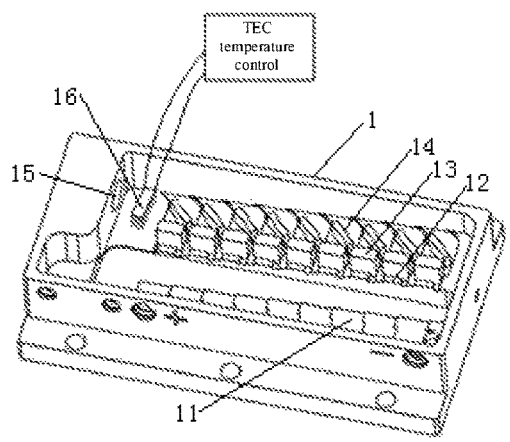
FIG. 5 is a structural diagram of a light-emitting module of the present application.

As shown in FIG. 5, the light-emitting module 1 of the present application is a square box-shaped laser module which is internally provided with a laser unit 11 for emitting laser, the laser units 11 are laser single-tube chips and are in step arrangement in the fast-axis direction, the laser unit is internally provided with a groove opening, the groove opening is provided with two rows of multi-stage steps, one row of multi-stage steps are correspondingly provided with a plurality of laser units 11, and the other row of multi-stage steps are correspondingly provided with a plurality of collimating systems and reflectors 14, a light outlet hole 15 for emitting laser is arranged on the side (e.g., the upper left corner as shown in FIG. 1) on the light-emitting module 1, the reflective surfaces of a plurality of reflectors 14 are arranged towards the light outlet hole 15, a Bragg grating 16 is arranged between the reflector 14 and the light outlet hole 15, the Bragg grating 16 is connected with a temperature control device 17 through a heating element. Multiple laser units 11 in each light-emitting module 1 are arranged side by side in the slow-axis direction, that is, the horizontal direction, and are arranged in steps along the fast-axis direction, that is, the vertical direction; specifically, as shown in FIG. 5, each light-emitting module 1 includes a plurality of laser single-tube chips 111-11$n$, the plurality of laser single-tube chips 111-11$n$ are arranged on the multi-stage step in a one-to-one correspondence manner, and the height difference of two adjacent laser single-tube chips arranged in a step array is the same; the emergent surface of each laser single-tube chip is provided with a collimating system and a reflector in sequence, the collimating system includes a fast-axis collimating lens configured to compress a divergence angle in a laser fast-axis direction and a slow-axis collimating lens configured to compress the divergence angle in a laser slow-axis direction arranged in sequence on the emergent surface of a laser single-tube chip, the reflector 14 is arranged on the emergent surface of the slow-axis collimating lens, and a plurality of reflectors 14 are correspondingly arranged on another row of multi-stage steps, and are also arranged in steps, and the height difference of two adjacent reflectors 14 is also the same; the lights emitted by a plurality of laser single-tube chips are completely collimated by a collimating system, and are subjected to spatial beam combining in the fast-axis direction under the effect of a corresponding reflector, and a larger number of laser single-tube chips may be arranged in a smaller space. The reflector 14 is a 45-degree reflector and is arranged to be vertical to the horizontal plane, and forms an angle of 45° with the optical axis of a collimating system composed of a fast-axis collimating lens and a slow-axis collimating lens, the arrangement of a plurality of reflectors 14 achieves beam combining of the lasers emergent by a plurality of semiconductor laser single-tube chips spatially, a spatial beam combining light is formed under the effect of the reflector 14, and the spatial beam combining light is incident to the Bragg grating 16, and a part of the spatial beam combining light penetrates through the Bragg grating 16 as an output light, the other part is taken as a feedback light, returns to the inside of the laser single-tube chip, and is configured to lock the wavelength of the laser emergent by the semiconductor laser single-tube chip, the Bragg grating 16 and the laser single-tube chip constitute an external cavity, feedback light forms mode competition inside the chip, thereby achieving wavelength selection, such that the light-emitting module 1 is output at a locked wavelength. As an alternative embodiment, the front cavity surface of the laser single-tube chip of the present application is coated with an anti-reflection film chip, which is not specifically defined.

The fast-axis collimating lens 12 and the slow-axis collimating lens 13 of the present application are collimating lenses available on the market now, and specific structures and working principles are not described and defined herein, and will be selected according to actual requirements. As an alternative embodiment, both the fast-axis collimating lens 12 and the slow-axis collimating lens 13 of the present application are coated with anti-reflection films. Due to the reduction of beam reflection, the transmittance after coating should be above 99% relative to the beam wavelength of the laser chip, which is not defined herein.

Figure 6:
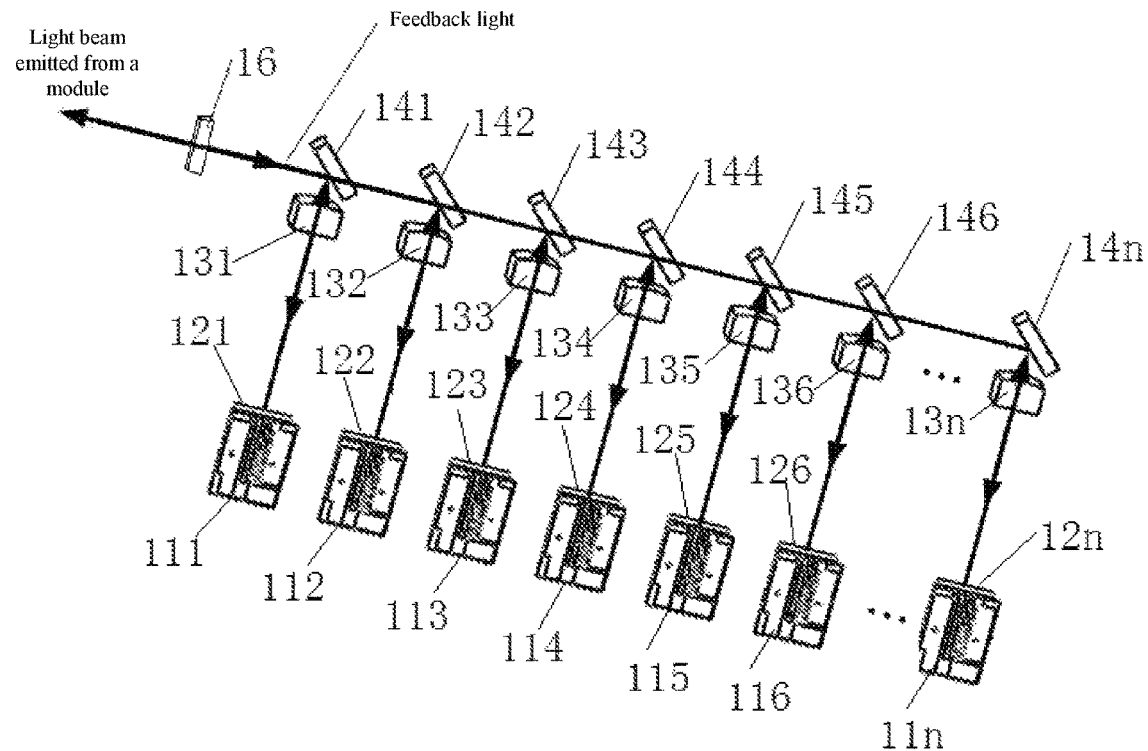
FIG. 6 is a schematic diagram of an optical path of a light-emitting module of the present application.

The principle of the optical path of the light-emitting module 1 of the present application is as shown in FIG. 6, the laser emitted by the laser single-tube chip 111 is collimated by the fast-axis collimating lens 121 on the fast-axis direction, the light collimated in the fast-axis direction reaches the slow-axis collimating lens 131, the collimated light in the fast-axis direction is collimated by the slow-axis collimating lens 131 in the slow-axis direction, the collimated light becomes complete collimated light, the complete collimated light is reflected by the reflector 141 on the emergent surface of the slow-axis collimating lens 131 and is emitted from the module; the light emitted by the laser single-tube chip 112 having a step height difference with the laser single-tube chip 111 is collimated by the fast-axis collimating lens 122 and the slow-axis collimating lens 132 and reaches the reflector 142, the reflector 142 also has a step height difference with the reflector 141, the light emitted by the laser single-tube chip 112 is emitted by the reflector 142 and passes above the reflector 141, to achieve beam combining in the fast-axis direction with the light emitted by the laser single-tube chip 111; similarly, the laser emitted by a plurality of laser single-tube chips in step arrangement are combined spatially to form output light of the light-emitting module 1. Each light-emitting module 1 includes a plurality of laser single-tube chips, the plurality of laser single-tube chips are arranged with a step height difference, more semiconductor laser single tubes are integrated in a smaller space, light beams of a larger number of single tubes may be subjected to spatial beam combining to be directly output, and may also be coupled to an optical fiber 8 through an aspheric surface focusing lens (not shown in the figure) to constitute a tail fiber light-emitting module, to have greater output power.

The beam combining element 3 of the present application is a grating, and is arranged towards a convex surface of a Fourier transform lens, and polarization of the beam combining element 3 is consistent with the polarization of the light beam emitted by the light-emitting module; the diffraction efficiency of grating should be over 90% in the corresponding polarization direction; the central wavelength of grating is in a range of $\lambda_0$ to $\lambda_n$; the grating is placed in a blaze angle relative to an optical axis, and the grating may be a transmission grating, and may also be a reflection grating.

The dispersion element 5 of the present application is a grating, the central wavelength of the grating is in a range of $\lambda_0$ to $\lambda_n$; the grating may be a transmission grating and may also be a reflection grating, and the structure and working principle are not described and defined herein, and can be selected according to actual requirements.

The beam combining element 3 and the dispersion element 45 of the present application are placed at respective blaze angle relative to an optical axis; for example, the beam combining light formed when the output light of each light-emitting module 1 is combined by the beam combining element 3 and the beam combining element 3 are emitted at a diffraction angle of $\alpha_{Littrow}$ a part of the light beam after the emergent light beam is subjected to the effect of the light splitting element 4 is incident to the dispersion element 5 at a diffraction angle of $\beta_{Littrow}$; the two diffraction angles may be equal or may be unequal, mainly depending on whether the beam combining element 3 and the dispersion element 5 are the same grating, if they are the same grating, the diffraction angles of the two are equal; if they are not the same grating, then the diffraction angles of the two are unequal; correspondingly, when the beam combining element 3 and the dispersion element 5 are the same grating, the incident angle $\alpha_n$ formed when the output light of each light-emitting module 1 is incident to the beam combining element 3 is equal to the emergence angle $\beta_n$ emergent from the dispersion element 5; if the beam combining element 3 and the dispersion element 5 are not the same grating, then the incident angle $\alpha_n$ is not equal to the emergence angle $\beta_n$.

The beam combining element 3 and the dispersion element 5 of the present application may be both transmission gratings, may also be both reflection gratings, or one of them is a transmission grating, while the other is a reflection grating, which is not specifically defined, as long as dispersion may be performed after beam combining; as shown in FIG. 1 to FIG. 4, after passing through the beam combining element 3, the light splitting element 4 and the dispersion element 5, the emergent direction of the output light of the light-emitting module above the reference module 100 is rightwards, while after passing through the combining element 3, the light splitting element 4 and the dispersion element 5, the emergent direction of the output light of the light-emitting module below the reference module 100 is leftwards.

The focusing optical element 2 of the present application is a Fourier transform lens, the Fourier transform lens is a columnar lens with a flat side and a convex side, the flat side is set towards the light-emitting module 1, and the convex side is arranged back to the light-emitting module 1 and towards the beam combining element 3. The specific structure and working principle are not described and defined herein, and Fourier transform lenses of different focal lengths can be selected according to actual requirements. For example, it can be known from the above formula that, in order to obtain more beam combining units in the same spectral width range, a Fourier transform lens with a long focal length can be selected, for specific situations, selection can be made according to actual requirements. Optionally, the focusing optical element 2 of the present application can also be other common focusing optical elements, as long as laser of different wavelengths emitted by different light-emitting modules can be focused and incident to the beam combining element.

The conversion optical element 6 of the present application is an existing ordinary conversion cylindrical lens, as long as the sub-beam of different emergence angles after dispersion by the dispersion element 5 is converted into parallel sub-beam, and the specific structure and principle will not be described and defined.

Figure 7:
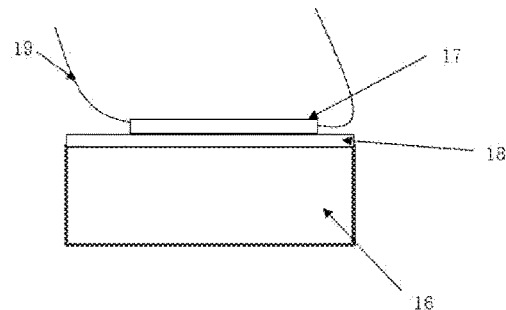
FIG. 7 is a structural diagram of a temperature control element of the present application.

The temperature control device 17 of the present application includes a temperature adjustment element connected with a Bragg grating 16; a temperature detection element (not shown in the figure) configured to detect temperature of the Bragg grating 16; and a controller (not shown in the figure) electrically connected with both the temperature adjustment element and the temperature detection element, wherein the controller controls the temperature rise or reduction of the heating element according to the detection signal of the temperature detection element; the temperature adjustment element includes a heating element or a cooling element; when temperature rise is required, the heating element is turned on; and when temperature reduction is required, the cooling element is turned on. As shown in FIG. 7, the temperature control device 1617 of the present application is a TEC temperature control device commonly seen on the market now, and the specific structure and working principle are not described and defined herein, the temperature control device 17 of the present application is in contact connection with the Bragg grating 16 through heat-conducting glass 18, and is electrically connected with the controller through the wire 19, the controller is connected with the image acquisition mechanism 7, and a closed-loop connection is formed between the image acquisition mechanism 7 and the Bragg grating 16; the image acquisition mechanism 7 acquires image spots of the output light of the light-emitting module 1 on the image acquisition mechanism, compares with the preset spot range, and judges whether a deviation exists, if a deviation exists, the controller converts the deviation into the wavelength deviation of the laser emitted by the corresponding light-emitting module 1, and converts into the temperature deviation of the Bragg grating 16 of the corresponding light-emitting module 1, the temperature difference between the Bragg grating 16 of the light-emitting module 1 and the preset Bragg grating 16 is obtained according to the relationship between the temperature of the Bragg grating 16 and wavelength, and further the temperature of the Bragg grating 16 is adjusted through temperature rise or reduction by the temperature control device 17, such that the wavelength of laser emitted by corresponding light-emitting module 1 reaches a preset wavelength range, to achieve wavelength locking.

The image acquisition mechanism 7 of the present application is a CCD, such as a linear array CCD or an area array CCD, etc., which is not specifically defined herein, of course, the image acquisition mechanism 7 can also be other image acquisition devices in the prior art, and the specific structure and working principle are not defined and described herein.

In order to achieve beam combining at the beam combining element 3, that is, the grating, according to the dispersion characteristic of grating, the central wavelength of the n-th light-emitting module needs to be locked at $\lambda_0$, the locked wavelength $\lambda_n$ of the n-th light-emitting module and the locked wavelength $\lambda_0$ corresponding to the reference light-emitting module 100 satisfy the following geometrical relationship:

$$\lambda_n = \lambda_0 + n \cdot \frac{d \cdot p}{f_{TL}} \cos\alpha_{Littrow}, n = \pm 1, \pm 2, \pm 3, \ldots, \pm N \tag{8}$$

wherein $\lambda_0$ is the central wavelength of the reference light-emitting module, $\lambda_n$ is the central wavelength of the n-th light-emitting module, d is the grating period of the grating, p is the interval of light-emitting modules, $f_{TL}$ is the focal length of the focusing optical element, and $\alpha_{Ltirrow}$ is the grating blaze angle;

The derivation process of the above formula is as follows:

according to the grating equation, the wavelength and the incident angle satisfy the following geometric relationship:

$$i.\ \lambda_n = d(\sin\alpha_n + \sin\alpha_{Ltirrow}), n = \pm 1, \pm 2, \pm 3, \ldots, \pm N \tag{1}$$

In the formula, $\lambda_n$ is the central wavelength of the output light of the n-th light-emitting module, $\alpha_n$ is the incident angle formed when the output light of the n-th light-emitting module is incident to the beam combining element 3, and $\alpha_{Littrow}$ is the grating blaze angle of the beam combining element 3.

Suppose that p is the interval between adjacent light-emitting modules, $f_{TL}$ is the effective focal length of the focusing optical element, then according to the geometric relationship of lens transformation, the incident angle formed when the output light of the n-th light-emitting module is incident to the beam combining element 3 is as follows:

1.

$$\alpha_n = \alpha_{Littrow} + \arctan\frac{n \cdot p}{f_{TL}}, n = \pm 1, \pm 2, \pm 3, \ldots, \pm N \tag{2}$$

the following formula can be obtained through combining (1) and (2):

2.

$$\lambda_n = d \cdot \left[\sin\alpha_{Littrow} + \sin\left(\alpha_{Littrow} + \arctan\frac{n \cdot p}{f_{TL}}\right)\right], \tag{3}$$

$$n = \pm 1, \pm 2, \pm 3, \ldots, \pm N$$

during application, $f_{TL} \gg n \cdot p$ is generally satisfied, therefore, approximate arctan $$\frac{n \cdot p}{f_{TL}} \approx \frac{n \cdot p}{f_{TL}}$$

can be taken, then formula (3) may be simplified as follows:

$$\lambda_n = d \cdot \left[ \sin\alpha_{Littrow} + \sin\left(\alpha_{Littrow} + \frac{n \cdot p}{f_{TL}}\right) \right], \quad (4)$$
$$n = \pm 1, \pm 2, \pm 3, \ldots, \pm N$$

a first derivative is obtained with respect to $\lambda_n$ and n at both sides, to obtain the wavelength interval of the central wavelength of the output light of adjacent light-emitting modules.

$$\Delta\lambda(n) = \frac{d \cdot p}{f_{TL}} \cos\left(\alpha_{Littrow} + \frac{n \cdot p}{f_{TL}}\right), \quad (5)$$
$$n = \pm 1, \pm 2, \pm 3, \ldots, \pm N$$

Generally, the blaze angle of grating is larger, during application, the blaze angle not only satisfies $f_{TL} \gg n \cdot p$, but also satisfies $$\alpha_{Littrow} \gg \frac{n \cdot p}{f_{TL}},$$

at this time, formula (5) may be simplified as:

$$\Delta\lambda = \frac{d \cdot p}{f_{TL}} \cos\alpha_{Littrow} \quad (6)$$

it may be known from formula (5) and formula (6) that, the central wavelength of the output light of the n-th light-emitting module needs to be locked at $\lambda_n$, the locked wavelength may be calculated as follows:

$$\lambda_n = \lambda_0 + n \cdot \Delta\lambda \quad (7)$$

that is, $$\lambda_n = \lambda_0 + n \cdot \frac{d \cdot p}{f_{TL}} \cos\alpha_{Littrow}, n = \pm 1, \pm 2, \pm 3, \ldots, \pm N \quad (8)$$

It can be known from the above formula that, the wavelength interval of beam combining is directly proportional to the grating period and light-emitting module interval, and is inversely proportional to the focal length of the focusing optical element; therefore, the wavelength interval of beam combining can be reduced by selecting a focusing optical element with a long focal length, thereby accommodating more beam combining units within the same wide spectral range, and further providing system power and increasing the output beam brightness of a system.

Figure 3:
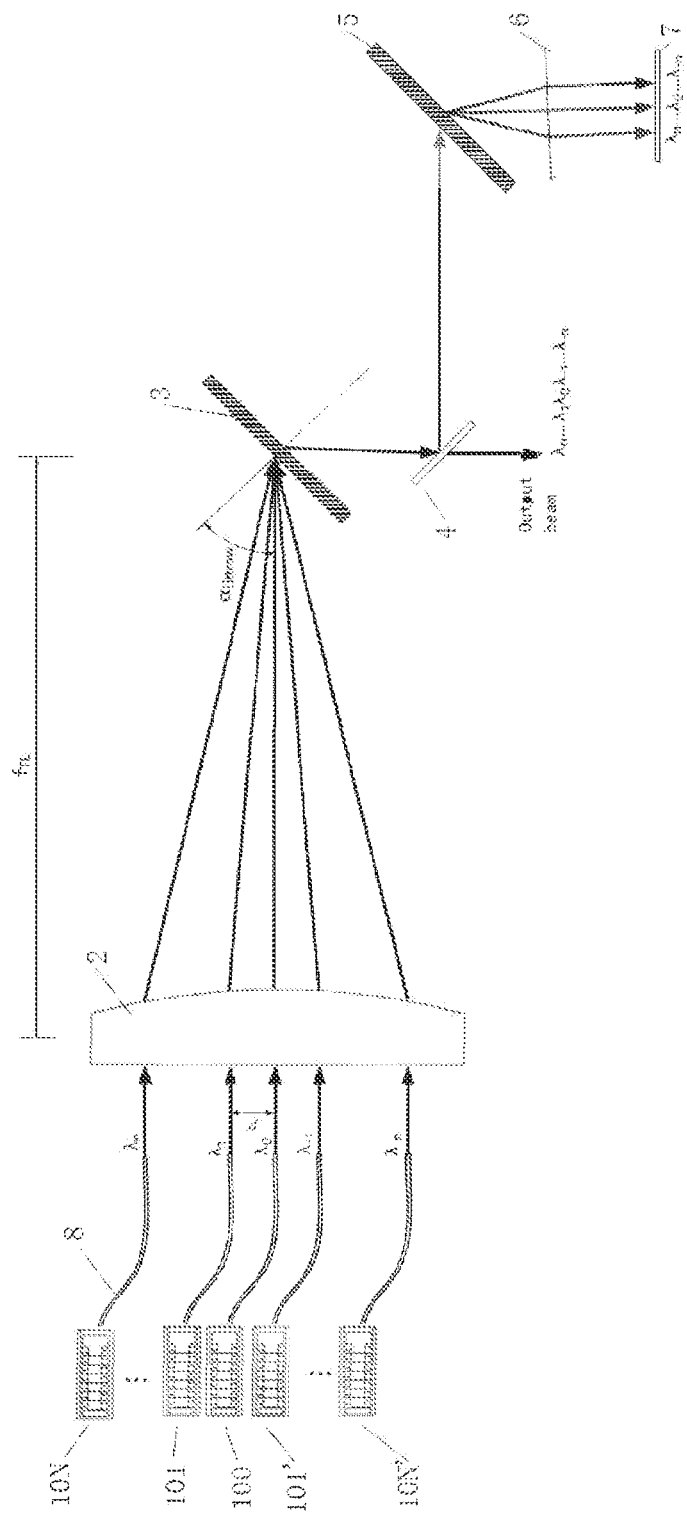
FIG. 3 is a structural diagram showing that laser of a light-emitting module of the present application is coupled to an optical fiber to achieve tail fiber output and a beam combining element is a transmission grating.

Please refer to FIG. 1 and FIG. 3, the beam combining element 3 of the system is a transmission grating, the transmission grating is placed at a blaze angle of $\alpha_{Littrow}$ relative to an optical axis, the laser emitted by n laser chips 11 of n light-emitting modules is completely collimated by a collimating system, and is reflected by a reflector for spatial beam combining in a fast-axis direction to reach a Bragg grating 16, the laser is output to a Fourier transform lens from a light outlet hole 15 after the wavelength is locked through the Bragg grating 16, after transformation, position information of lasers of different wavelengths emitted by different light-emitting modules 1 is converted into angle information and is focused and incident to the surface of a transmission grating at different incident angles $\alpha_n$, under the effect of the transmission grating, different sub-beams are output at the same diffraction angle $\alpha_{Littrow}$ (the grating blaze angle of the beam combining element 3), to form a beam combining light, the beam combining light is irradiated onto the surface of the light splitting element 4, and is divided into reflected light and transmitted light under the effect of the light splitting element 4, the transmitted light is output after passing through the light splitting element 4, the reflected light is incident to the surface of the grating at an incident angle of $\beta_{Littrow}$ (the grating blaze angle of a dispersion element 5) after being reflected by the light splitting element 4; the beam combing light is re-dispersed into sub-beams of different angles under the dispersion effect of grating, each sub-beam is output at an angle of $\beta_n$, and is incident to the conversion optical element 6, each sub-beam forms parallel light to output and is vertically imaged onto a CCD under the effect of the conversion optical element 6, and spots of equal intervals are formed on the CCD. The transmission grating of the present application is a transmission grating available on the market now, its specific structure and working principle are not defined and described herein, and will be selected according to actual requirements.

Figure 2:
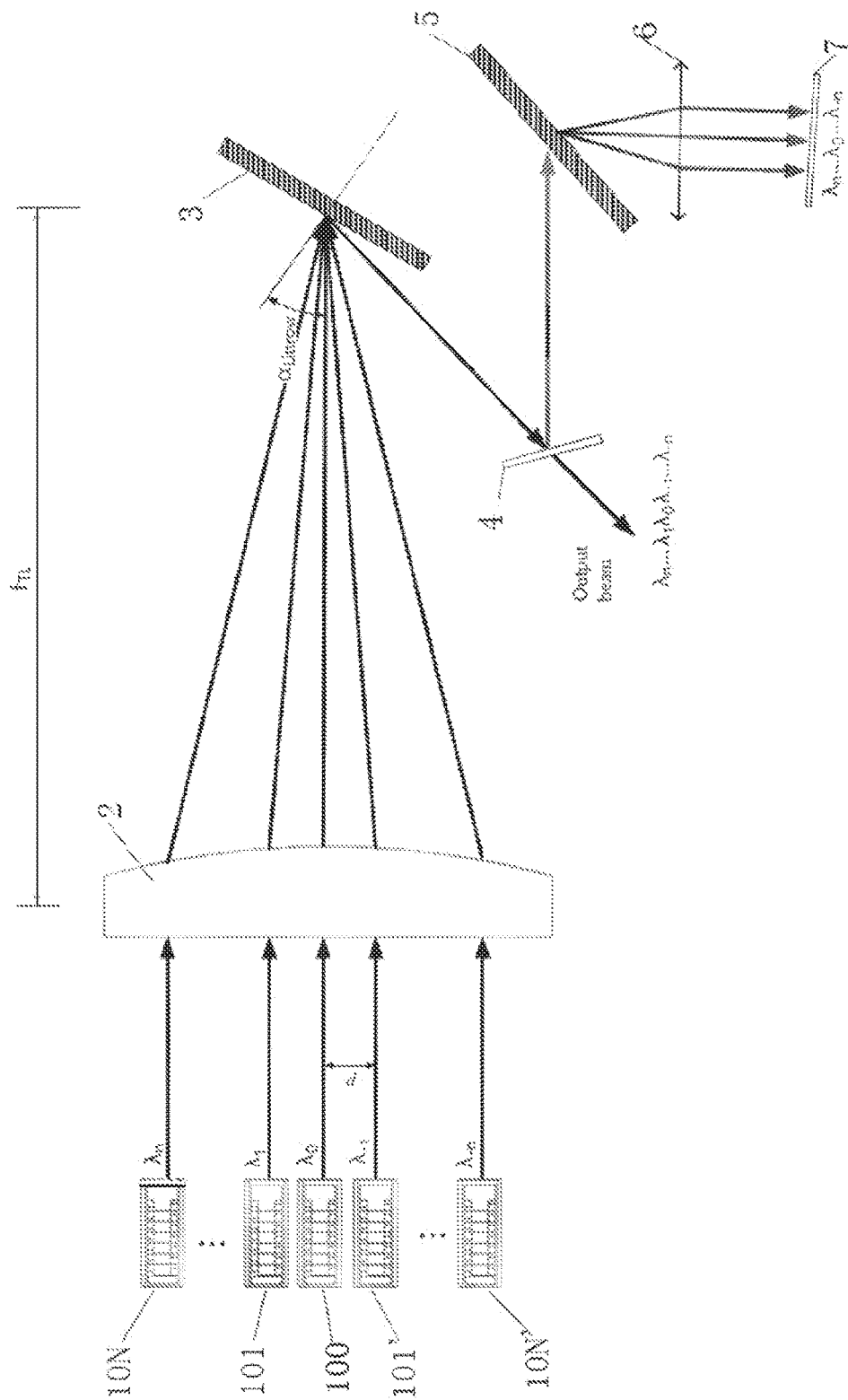
FIG. 2 is a structural diagram showing that a light-emitting module of the present application directly outputs laser and a light combining element is a reflection grating.
Figure 4:
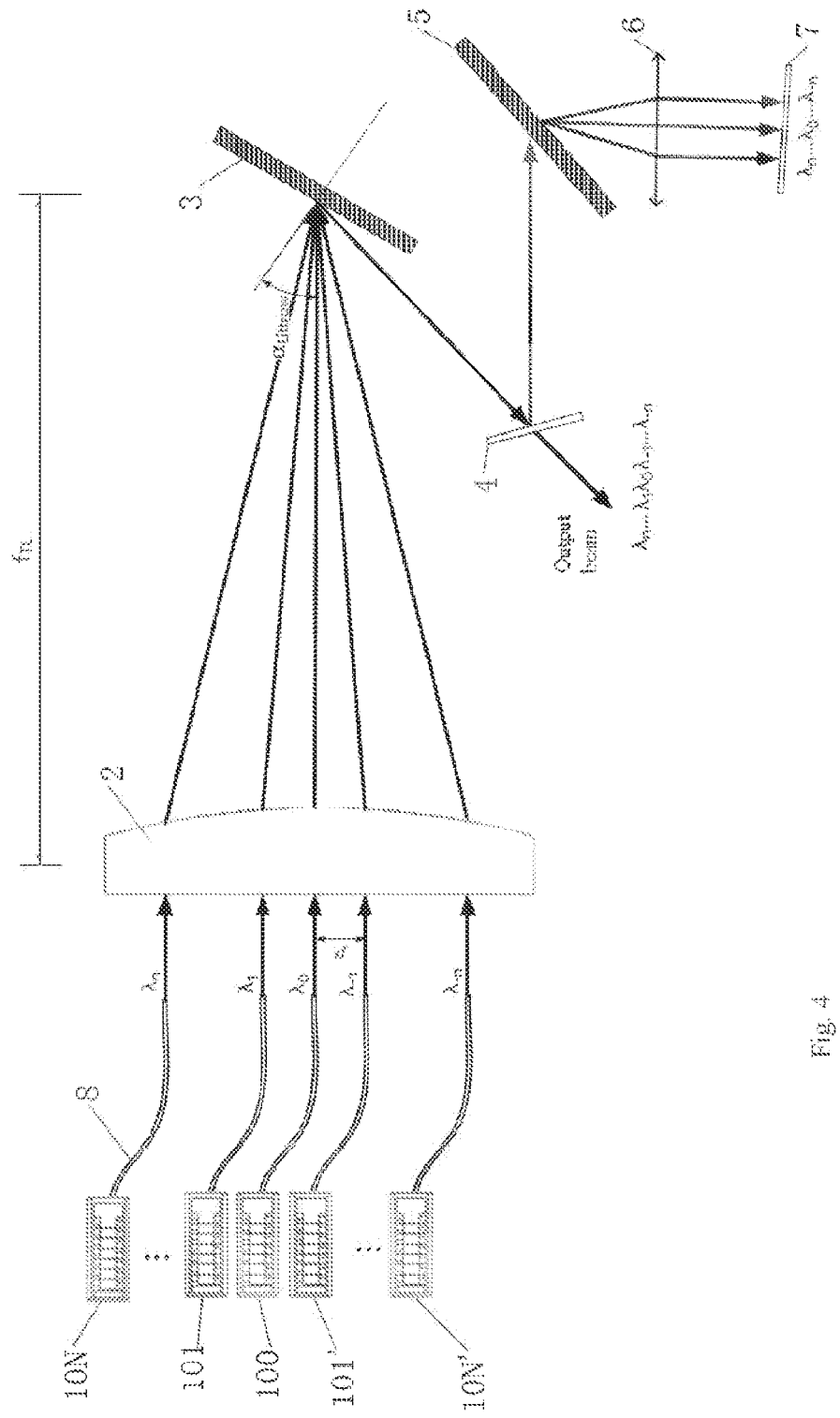
FIG. 4 is a structural diagram showing that laser of a light-emitting module of the present application is coupled to an optical fiber to achieve tail fiber output and a beam combining element is a reflection grating.

Please refer to FIG. 2 and FIG. 4, the beam combining element 3 of the system is a reflection grating, the reflection grating is placed at a blaze angle of $\alpha_{Littrow}$ relative to an optical axis, the laser emitted by n laser chips 11 of n light-emitting modules 1 are completely collimated by a collimating system, and is reflected by a reflector for spatial beam combining in a fast-axis direction to reach a Bragg grating 16, the laser is output to a Fourier transform lens from a light outlet hole 15 after the wavelength is locked through the Bragg grating 16, after Fourier transformation, position information of lasers of different wavelengths emitted by different light-emitting modules is converted into angle information and is focused and incident to the surface of a transmission grating at different incident angles $\alpha_n$, under the effect of the reflection grating, each beam is output at the same reflection angle $\alpha_{Littrow}$ (the grating blaze angle of the beam combining element), to form a beam combining light, the beam combining light is reflected onto the surface of the light splitting element 4, and is divided into reflected light and transmitted light under the effect of the light splitting element 4, the transmitted light is output after passing through the light splitting element, the reflected light is incident to the surface of the grating at an angle of $\beta_{Littrow}$ (the grating blaze angle of a dispersion element) after being reflected by the light splitting element 4; the beam combing light is re-dispersed into sub-beams of different angles under the dispersion effect of grating, each sub-beam is output at an angle of $\beta_n$, and is incident to the conversion optical element 6, each sub-beam forms parallel light to output and is vertically imaged onto a CCD under the effect of the conversion optical element 6, and spots of equal intervals are formed on the CCD. The reflection grating of the present application is a reflection grating available on the market now, its specific structure and working principle are not defined and described herein, and will be selected according to actual requirements.

The above $\beta_{Littrow}$ and $\alpha_{Littrow}$ are the same when the beam combining element 3 and the dispersion element 5 are the same grating, and are different when the beam combining element 3 and the dispersion element 5 are not the same grating; similarly, the above $\beta_n$ and $\alpha_n$ are the same when the beam combining element 3 and the dispersion element 5 are the same grating, and are different when the beam combining element 3 and the dispersion element 5 are not the same grating.

Embodiment 2

The beam combining method of the present embodiment is based on the beam combining device for a Bragg grating external-cavity laser module in embodiment 1, as shown in FIG. 1 to FIG. 10, the beam combining method includes the following steps:

acquiring an image, wherein the image includes a reference spot and a number of spots to be compared, the reference spot corresponds to a laser of the output wavelength ($\lambda_0$) of the reference light-emitting module 100 (e.g., the light-emitting module marked with $\lambda_0$ in FIG. 1), and the spots to be compared are in one-to-one correspondence with the lasers of the output wavelengths of other light-emitting modules (e.g., the light-emitting modules marked with $\lambda_1$–$\lambda_N$ and $\lambda_{-1}$–$\lambda_{-N}$ in FIG. 1);

acquiring a preset spot range respectively corresponding to each spot to be compared based on the reference spot;

comparing any one of the spots to be compared with corresponding preset spot range;

judging whether the spot to be compared falls within corresponding preset spot range; and adjusting a locked wavelength of the Bragg grating in the light-emitting module corresponding to the spot to be compared if the spot to be compared exceeds corresponding preset spot range, such that the spot to be compared falls within corresponding preset spot range.

In the step of judging whether the spot to be compared falls within corresponding preset spot range, a deviation between the spot to be compared and the corresponding preset spot is no greater than 2 pixel points, indicating that the spot to be compared falls within corresponding preset spot range.

in the step of adjusting a locked wavelength of the Bragg grating in the light-emitting module corresponding to the spot to be compared if the spot to be compared exceeds corresponding preset spot range, the locked wavelength of the Bragg grating is adjusted through adjusting the temperature of the Bragg grating in the light-emitting module corresponding to the spot to be compared.

In the step of acquiring a preset spot range respectively corresponding to each spot to be compared based on the reference spot, a spacing between the reference spot and the adjacent preset spot is equal to a spacing between any adjacent preset spots.

Since the imaged spot of the output light of each light-emitting module on the image acquisition mechanism is not a point, but an area, and when reflected on a processed image, the above preset spot range can be described with a position interval between each spot to be compared and a reference spot.

It can be known from the above wavelength locking formula that, the incident angle formed when the output light of the n-th light-emitting module 1 is incident to the beam combining element 3 is as follows:

$$\alpha_n = \alpha_{Littrow} + \arctan\frac{n \cdot p}{f_{TL}}, n = \pm 1, \pm 2, \pm 3, \ldots, \pm N \qquad (9)$$

The beam combining light subjected to beam combining by the beam combining element 3 and the beam combining element are emergent at a diffraction angle of $\alpha_{Littrow}$, a part of the emergent light beam under the effect of a light splitting element 4 is incident onto a dispersion element 5 at an angle of $\beta_{Littrow}$, according to the diffraction characteristic of grating, as to the light beam with a wavelength of $\lambda_n$ (n=±1,±2,±3, . . . ,±N), suppose that the focal length of a conversion optical element 6 is f, the interval of spots on the image acquisition mechanism 7 is $p_0$, then according to a geometrical relationship, $$\beta_n = \beta_{Littrow} + \arctan\frac{n \cdot p_0}{f}, n = \pm 1, \pm 2, \pm 3, \ldots, \pm N \qquad (10)$$

$$p_0 = \frac{f}{n} \cdot \tan(\beta_n - \beta_{Littrow})$$

(11) is obtained through calculation.

The light-emitting modules to be compared (e.g., the light-emitting modules marked with output wavelengths of $\lambda_1$–$\lambda_N$ and $\lambda_{-1}$–$\lambda_{-N}$ in the figure) are symmetrically arranged up and down relative to the reference light-emitting module 100 (e.g., the light-emitting module marked with an output wavelength of $\lambda_0$ in the figure), and the spot to be compared formed by the output light of the module to be compared on the image acquisition mechanism 7 is eudipleural with the reference spot of the output light of the reference light-emitting module 100 on the image acquisition mechanism 7; it may be known from the above formula (7) that, the locked wavelength of the output light of the light-emitting module 1 may be decreased by $\Delta\lambda$ from top to bottom, correspondingly, the corresponding wavelength of the corresponding spot on the image acquisition mechanism 7 is also decreased by $\Delta\lambda$ from left to right, since corresponding wavelengths of adjacent spots are equally spaced, therefore, the intervals between adjacent spots are also equal;

the theoretical interval value $p_0$ between adjacent spots can be obtained through calculation from the above formula (10), therefore, the preset spot range of the spot to be compared of each light-emitting module on the image acquisition mechanism 7 can be obtained; in order to reduce errors, the light-emitting module with a locked wavelength of $\lambda_0$ may be taken as a reference, the spot of the light-emitting module on the image acquisition mechanism 7 is taken as the reference spot, and the theoretical interval between the spot to be compared and the reference spot is prestored in the controller.

Figure 8:
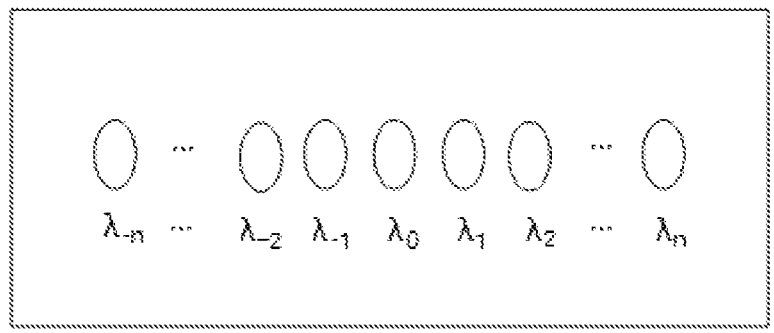
FIG. 8 is a structural schematic diagram of a theoretical position range of spots of a light-emitting module of the present application on the image acquisition mechanism.

FIG. 8 shows that imaged spots of the output light of the light-emitting module on the image acquisition mechanism are all in the theoretical position, that is, the imaged spots of the output light of each light-emitting module on the image acquisition mechanism are all in a preset spot range.

The image acquisition mechanism 7 acquires actual image information of a spot of each light-emitting module 1, the image acquisition mechanism processes the actual image information, and converts the image information into position information, to obtain the processed image, the image acquisition mechanism 7 feeds the acquired actual position information of the spot of each light-emitting module 1 to a controller, the controller analyzes to obtain the actual interval between the spot to be compared of each light-emitting module to be compared relative to the reference spot; from the actual spot range of the acquired reference spot, the controller calculates and analyzes to obtain the preset spot range of each module to be compared, the controller compares the actual spot of each light-emitting module to be compared of each light-emitting module to be compared with corresponding preset spot range, and judges whether the actual spot falls within the preset spot range, i.e., whether a deviation exists with the preset spot range, and then the controller converts the spot deviation into the wavelength deviation of the output light of the light-emitting module corresponding to the spot, and then converts the wavelength deviation into temperature deviation according to the temperature drift characteristics of the Bragg grating 16, and then obtains whether the temperature is raised or reduced and the specific value of temperature rise or reduction, and then the controller controls the temperature control device 17 to adjust the temperature of the Bragg grating 16 to achieve the beam combining of a plurality of light-emitting modules.

Figure 9:
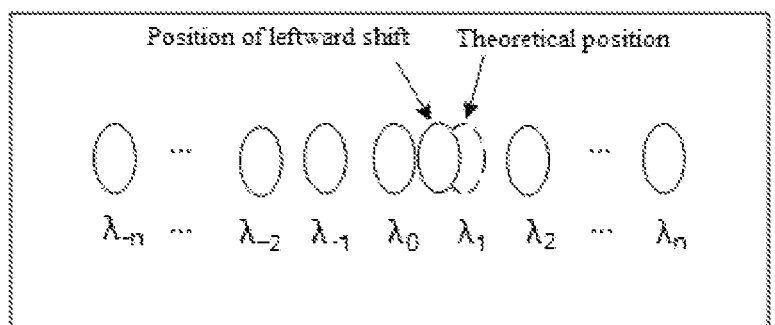
FIG. 9 is a structural schematic diagram of a light-emitting module of the present application when the spot to be compared on the image acquisition mechanism is shifted leftwards.
Figure 10:
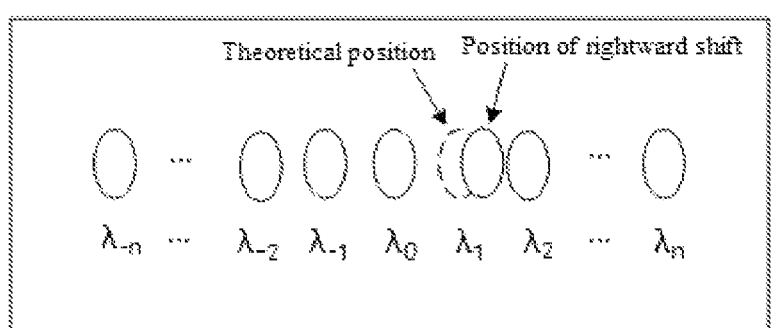
FIG. 10 is a structural schematic diagram of a light-emitting module of the present application when the spot to be compared on the image acquisition mechanism is shifted rightwards.

Suppose that a deviation exists between the spot to be compared of the n-th light-emitting module read out by a controller and a preset spot range, suppose the deviation is L (L is a negative value during leftward shift, as shown in FIG. 9; L is a positive value during rightward shift, as shown in FIG. 10), it can be known from the characteristics of grating that, the diffraction angle of the output light of the light-emitting module to be compared 1 at the diffusion element 5 is $\beta_n'$, according to a geometrical relationship, $$\beta_n' = \arctan\left(\frac{L + n \cdot p}{f}\right) \tag{12}$$

according to the grating equation, the locked wavelength is as follows:

$$\lambda_n = d(\sin\beta_{Littrow} + \sin\beta_n') \tag{13}$$

An actual locked wavelength of the light-emitting module corresponding to the spot to be compared is obtained at this time, and then the controller compares the actual locked wavelength with the locked wavelength of the light-emitting module from theoretical calculation (calculated through the above formula (8)); and finally wavelength deviation is converted into temperature deviation according to a geometrical relationship between the temperature and wavelength of a Bragg grating 16 in the above embodiment 1, then the actual temperature of the Bragg grating 16 of the light-emitting module 1 is obtained according to the calculated actual locked wavelength of the light-emitting module 1 corresponding to the spot to be compared which has deviation, and further the actual temperature is compared with a preset temperature, to obtain whether the temperature is raised or reduced and the specific value of temperature rise or reduction;

Finally, the temperature control device 17 is configured to raise or reduce the temperature to adjust the temperature of the Bragg grating 16 to adjust the locked wavelength of the corresponding light-emitting module 1; the temperature detection element detects the actual temperature of the Bragg grating 16, and the controller controls the heating or cooling element to turn on according to the temperature difference value obtained from calculation and analysis, and conducts heat to the Bragg grating 16 through the heat-conducting glass; when the temperature detection element detects that the temperature of the Bragg grating 16 reaches a preset value, the controller controls the heating or cooling element to turn off; the heat-conducting element and the Bragg grating are in contact connection to perform heat exchange, and even if the heating or cooling element is turned off, heat exchange continues to occur between the Bragg grating and the heat-conducting glass, therefore, an error may exist between the locked wavelength of the Bragg grating and the preset value, and then a deviation may also exist at the position of the spot on the image acquisition mechanism 7, but as long as the deviation between the spot range of the light-emitting module 1 on the image acquisition mechanism 7 and the preset spot range is within the range of two pixels, it indicates that the central wavelength of the light-emitting module has been locked.

Obviously, the foregoing embodiments are merely examples for clear description, and are not intended to limit the implementations. For those of ordinary skills in the art, other changes or modifications in different forms can be made on the basis of the above description. It is unnecessary and impossible to enumerate all the implementations herein. The obvious changes or variations derived from this shall still fall within the protection scope of the present application.

The invention claimed is:

1. A beam combining device for a Bragg grating external-cavity laser module, comprising: at least two light-emitting modules arranged side by side at intervals, wherein any one of the light-emitting modules comprises a laser unit and a Bragg grating configured to receive laser emitted by the laser unit, and one light-emitting module serves as a reference light-emitting module; a focusing optical element arranged on an output optical path of all the light-emitting modules; and a beam combining element arranged on the focusing position of the output optical path of the focusing optical element; and further comprising:

a light splitting element, arranged on an output optical path of the beam combining element;

a dispersion element, arranged on any one of the output optical paths of the light splitting element, and configured to disperse beam combining light into dispersed light consistent with a relative positional relationship of the laser of each wavelength between the focusing optical element and the beam combining element;

a conversion optical element, arranged on an output optical path of the dispersion element, and configured to transmit the dispersed light into parallel light; and an image acquisition mechanism, arranged on an output optical path of the conversion optical element, and configured to acquire spots illuminated by the parallel light on the output optical path of the conversion optical element;

and the beam combining element and the dispersion element are both gratings.

2. The beam combining device for a Bragg grating external-cavity laser module of claim 1, wherein at least three light-emitting modules are available, and all the light-emitting modules are arranged side by side at equal intervals.

3. The beam combining device for a Bragg grating external-cavity laser module of claim 1, wherein the beam combining element and the dispersion element are both transmission gratings or reflection gratings, a diffraction angle formed when the beam combining light passes through the beam combining element is a grating blaze angle of the beam combining element, and an incident angle formed when the beam combining light is incident to the dispersion element is a grating blaze angle of the dispersion element.

4. The beam combining device for a Bragg grating external-cavity laser module of claim 1, wherein any one of the light-emitting modules further comprises an optical fiber arranged on an output optical path of the Bragg grating.

5. The beam combining device for a Bragg grating external-cavity laser module of claim 1, further comprising a temperature control device, wherein the temperature control device comprises:
 a temperature adjustment element, arranged on the Bragg grating;
 a temperature detection element, configured to detect temperature of the Bragg grating; and
 a controller, electrically connected with both the temperature adjustment element and the temperature detection element, wherein the controller controls the temperature rise or reduction of the temperature adjustment element according to detection signals of the temperature detection element.

6. A beam combining method based on the beam combining device for a Bragg grating external-cavity laser module of claim 1, comprising the following steps:
 acquiring an image, wherein the image comprises a reference spot and a number of spots to be compared, the reference spot corresponds to a laser of the output wavelength of the reference light-emitting module, and the spots to be compared are in one-to-one correspondence with the lasers of the output wavelengths of other light-emitting modules;
 acquiring a preset spot range respectively corresponding to each spot to be compared based on the reference spot;
 comparing any one of the spots to be compared with corresponding preset spot range;
 judging whether the spot to be compared falls within corresponding preset spot range; and
 adjusting a locked wavelength of the Bragg grating in the light-emitting module corresponding to the spot to be compared if the spot to be compared exceeds corresponding preset spot range, such that the spot to be compared falls within corresponding preset spot range.

7. The beam combining method based on the beam combining device for a Bragg grating external-cavity laser module of claim 6, wherein in the step of judging whether the spot to be compared falls within corresponding preset spot range,
 a deviation between the spot to be compared and the corresponding preset spot is no greater than 2 pixel points, indicating that the spot to be compared falls within corresponding preset spot range.

8. The beam combining method based on the beam combining device for a Bragg grating external-cavity laser module of claim 6, wherein
 in the step of adjusting a locked wavelength of the Bragg grating in the light-emitting module corresponding to the spot to be compared if the spot to be compared exceeds corresponding preset spot range,
 the locked wavelength of the Bragg grating is adjusted through adjusting the temperature of the Bragg grating in the light-emitting module corresponding to the spot to be compared.

9. The beam combining method based on the beam combining device for a Bragg grating external-cavity laser module of claim 6, wherein
 in the step of acquiring a preset spot range respectively corresponding to each spot to be compared based on the reference spot, a spacing between the reference spot and the adjacent preset spot is equal to a spacing between any adjacent preset spots.

* * * * *